(12) United States Patent
Liu et al.

(10) Patent No.: US 12,237,339 B2
(45) Date of Patent: Feb. 25, 2025

(54) DISPLAY PANEL

(71) Applicants: HUIZHOU CHINA STAR OPTOELECTRONICS DISPLAY CO., LTD., Guangdong (CN); TCL CHINA STAR OPTOELECTRONICS TECHNOLOGY CO., LTD., Guangdong (CN)

(72) Inventors: Jing Liu, Shenzhen (CN); Hongzhao Deng, Shenzhen (CN); Zhengbo Cui, Shenzhen (CN); Hao Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/765,218

(22) PCT Filed: Mar. 29, 2022

(86) PCT No.: PCT/CN2022/083662
§ 371 (c)(1),
(2) Date: Mar. 30, 2022

(87) PCT Pub. No.: WO2023/173481
PCT Pub. Date: Sep. 21, 2023

(65) Prior Publication Data
US 2024/0072066 A1     Feb. 29, 2024

(30) Foreign Application Priority Data
Mar. 16, 2022   (CN) .................. 202210257276.2

(51) Int. Cl.
*H01L 27/12*     (2006.01)
*H01L 25/16*     (2023.01)

(52) U.S. Cl.
CPC .......... *H01L 27/124* (2013.01); *H01L 25/167* (2013.01)

(58) Field of Classification Search
CPC ........................ H01L 27/124; H01L 25/167
(Continued)

(56) References Cited

U.S. PATENT DOCUMENTS

2024/0055418 A1*   2/2024   Liu ................... H01L 27/124

FOREIGN PATENT DOCUMENTS

| CN | 105260544 A | 1/2016 |
|---|---|---|
| CN | 106444189 A | 2/2017 |

(Continued)

OTHER PUBLICATIONS

Translation CN 118734761 (Year: 2022).*
(Continued)

*Primary Examiner* — Jami Valentine Miller
(74) *Attorney, Agent, or Firm* — PV IP PC; Wei Te Chung (57) ABSTRACT

A display panel is provided, including a grounding signal wiring, driving chips, a driving chip input output signal wiring, and a power line. A grounding signal pin is connected to the grounding signal wiring. The driving chip input output signal wiring is configured to connect a stage-transfer signal input pin and a stage-transfer signal output pin of two adjacent driving chips. The grounding signal wiring, the driving chip input output signal wiring, and the power line are disposed in a same layer and do not intersect with each other.

20 Claims, 1 Drawing Sheet

(58) Field of Classification Search
USPC ............................................................ 257/79
See application file for complete search history.

(56) References Cited

FOREIGN PATENT DOCUMENTS

| | | | |
|---|---|---|---|
| CN | 110649059 A | | 1/2020 |
| CN | 111273472 A | | 6/2020 |
| CN | 112230471 A | | 1/2021 |
| CN | 112992879 A | | 6/2021 |
| CN | 113311964 A | | 8/2021 |
| CN | 113851080 A | | 12/2021 |
| CN | 113870770 A | | 12/2021 |
| CN | 114171546 A | * | 3/2022 |
| CN | 114185200 A | | 3/2022 |
| JP | 2016133519 A | | 7/2016 |
| JP | 2018530792 A | | 10/2018 |
| WO | WO-2022015126 A1 | * | 1/2022 ............... G09G 3/32 |

OTHER PUBLICATIONS

Translation WO_2022015126 (Year: 2022).*
PCT International Search Report for International Application No. PCT/CN2022/083662, mailed on Jun. 27, 2022, 8pp.
PCT Written Opinion of the International Searching Authority for International Application No. PCT/CN2022/083662, mailed on Jun. 27, 2022, 8pp.
Chinese Office Action issued in corresponding Chinese Patent Application No. 202210257276.2 dated Oct. 24, 2022, pp. 1-8, 14pp.
Chinese Office Action issued in corresponding Chinese Patent Application No. 202210257276.2 dated Mar. 7, 2023, pp. 1-5, 11pp.
Japanese Office Action issued in corresponding Japanese Patent Application No. 特願2022-521059 dated Jun. 4, 2024, pp. 1-4, 8pp.

* cited by examiner

DISPLAY PANEL

CROSS REFERENCE TO RELATED APPLICATIONS

This application is a National Phase of PCT Patent Application No. PCT/CN2022/083662 having International filing date of Mar. 29, 2022, which claims the benefit of priority of Chinese Patent Application No. 202210257276.2, filed Mar. 16, 2022, the contents of which are all incorporated herein by reference in their entirety.

BACKGROUND OF INVENTION

Field of Invention

The present application relates to a field of display technology, and specifically to a display panel.

Description of Prior Art

Mini light emitting diodes (mini-LEDs) are also known as sub-millimeter light-emitting diodes, which refer to display screens constituted by LEDs with a die (chip) size ranging from 50 microns to 200 microns and between micro LEDs and small-pitch LED display. The mini-LEDs are widely used in mini-LED direct displays and display screens of mini-LED backlights.

In current products, manners of disposing metal wirings are manners of disposing two or more layers of metal wirings. For example, a driving chip input output signal wiring, a grounding wiring, and a power wiring are disposed in different layers. The manners of configuring the wirings can cause a problem that short circuit is prone to appear between different metal layers, i.e., to be short circuit easily, resulting in high cost and other problems.

SUMMARY OF INVENTION

Embodiments of the present application provide a display panel to solve the problem that the short circuit is prone to appear incurred by the driving chip input output signal wiring and the power supply wiring being arranged in two or more layers in the prior art.

The present application provides a display panel. Wherein, the display panel includes:
  a grounding signal wiring;
  a power line, wherein the power line and the grounding signal wiring are disposed parallelly and are spaced apart, and the power line and the grounding signal wiring extend along a first direction;
  a plurality of driving chips, wherein the plurality of driving chips are disposed between the grounding signal wiring and the power line, each of the driving chips includes a grounding signal pin, a stage-transfer signal input pin, a stage-transfer signal output pin, and a plurality of data selection pins, the grounding signal pin, the stage-transfer signal input pin, and the stage-transfer signal output are spaced apart on a side of the driving chips close to the grounding signal wiring along the first direction, and the plurality of data selection pins are spaced apart on a side of the driving chips close to the power line along the first direction, and the grounding signal pin is connected to the grounding signal wiring;
  a driving chip input output signal wiring, wherein the driving chip input output signal wiring is configured to connect the stage-transfer signal input pin and the stage-transfer signal output pin of two adjacent driving chips; and
  a plurality of light-emitting lamp groups, wherein the plurality of light-emitting lamp groups are located between the driving chips and the power line, one terminal of each of the light-emitting lamp groups is connected to corresponding data selection pins, and another one terminal of each of the light-emitting lamp groups is connected to the power line; and
  wherein the grounding signal wiring, the driving chip input output signal wiring, and the power line are disposed in a same layer and do not intersect with each other.

Optionally, in some embodiments of the present application, the display panel further includes a data readback wiring, the data readback wiring extends along the first direction and is disposed between the stage-transfer signal input pin and the data selection pins, and a terminal portion of the data readback wiring is connected to the stage-transfer signal output pin of the driving chip on an outermost side.

Optionally, in some embodiments of the present application, the driving chips further include a data signal pin and a power signal pin, the data signal pin and the power signal pin are respectively located on two sides of the data readback wiring, the display panel includes a data transmission wiring and a driving chip power wiring, the data transmission wiring extends along the first direction and is located between the data signal pin and the data readback wiring, the driving chip power wiring extends along the first direction and is located between the power signal pin and the data readback wiring, the data transmission wiring is connected to the data signal pin, and the driving chip power wiring is connected to the power signal pin.

Optionally, in some embodiments of the present application, the data signal pin and the plurality of data selection pins are arranged along the first direction, the power signal pin, the stage-transfer signal input pin, the stage-transfer signal output pin, and the grounding signal pin are arranged along the first direction, and the stage-transfer signal input pin and the stage-transfer signal output pin are located on two sides of the grounding signal pin.

In some embodiments of the present application, the plurality of driving chips are arranged along the first direction, and the stage-transfer signal input pin and the stage-transfer signal output pin are located on a terminal portion of pins in a column where they are located, and the driving chip input output signal wiring extends along the first direction.

Optionally, in some embodiments of the present application, the display panel further includes a partition channel wiring, and two terminals of the light-emitting lamp groups are connected to the data selection pins and the power line through the partition channel wiring.

Optionally, in some embodiments of the present application, there are four data selection pins in each of the driving chips, a number of the light-emitting lamp groups corresponding to each of the driving chips is four, the partition channel wiring includes first partition channel wirings and second partition channel wirings, one terminal of each of the light-emitting lamp groups is connected to one corresponding data selection pin through one of the first partition channel wirings, and another terminal of each of the light-emitting lamp groups is connected to the power line through the second partition channel wirings.

Optionally, in some embodiments of the present application, the driving chips further include at least one idle pin, and the idle pin is located at a column where the power signal pin is located at or a column where the data selection pin is located at.

Optionally, in some embodiments of the present application, the grounding signal wiring, the driving chip input output signal wiring, the data transmission wiring, the driving chip power wiring, the data readback wiring, the first partition channel wirings, the second partition channel wirings, and the power line are disposed in a same layer and are spaced apart.

Optionally, in some embodiments of the present application, the first partition channel wirings and the second partition channel wirings are arranged along the first direction.

One embodiment of the present application further provides a display panel. The display panel includes:
- a grounding signal wiring;
- a power line, wherein the power line and the grounding signal wiring are disposed parallelly and are spaced apart, and
- a plurality of driving chips, wherein the plurality of driving chips are disposed between the grounding signal wiring and the power line, each of the driving chips includes a grounding signal pin, a stage-transfer signal input pin, a stage-transfer signal output pin, and a plurality of data selection pins, the grounding signal pin, the stage-transfer signal input pin, and the stage-transfer signal output are spaced apart on a side of the driving chips close to the grounding signal wiring along a first direction, and the plurality of data selection pins are spaced apart on a side of the driving chips close to the power line along the first direction, and the grounding signal pin is connected to the grounding signal wiring;
- a driving chip input output signal wiring, wherein the driving chip input output signal wiring is configured to connect the stage-transfer signal input pin and the stage-transfer signal output pin of two adjacent driving chips; and
- a plurality of light-emitting lamp groups, wherein the plurality of light-emitting lamp groups are located between the driving chips and the power line, one terminal of each of the light-emitting lamp groups is connected to corresponding data selection pins, and another one terminal of each of the light-emitting lamp groups is connected to the power line; and
- wherein the grounding signal wiring, the driving chip input output signal wiring, and the power line are disposed in a same layer and do not intersect with each other.

Optionally, in some embodiments of the present application, the display panel further includes a data readback wiring, the data readback wiring extends along the first direction and is disposed between the stage-transfer signal input pin and the data selection pins, and a terminal portion of the data readback wiring is connected to the stage-transfer signal output pin of the driving chip on an outermost side.

Optionally, in some embodiments of the present application, the driving chips further include a data signal pin and a power signal pin, the data signal pin and the power signal pin are respectively located on two sides of the data readback wiring, the display panel includes a data transmission wiring and a driving chip power wiring, the data transmission wiring extends along the first direction and is located between the data signal pin and the data readback wiring, the driving chip power wiring extends along the first direction and is located between the power signal pin and the data readback wiring, the data transmission wiring is connected to the data signal pin, and the driving chip power wiring is connected to the power signal pin.

Optionally, in some embodiments of the present application, the data signal pin and the plurality of data selection pins are arranged along the first direction, the power signal pin, the stage-transfer signal input pin, the stage-transfer signal output pin, and the grounding signal pin are arranged along the first direction, and the stage-transfer signal input pin and the stage-transfer signal output pin are located on two sides of the grounding signal pin.

Optionally, in some embodiments of the present application, the plurality of driving chips are arranged along the first direction, and the stage-transfer signal input pin and the stage-transfer signal output pin are located on a terminal portion of pins in a column where they are located, and the driving chip input output signal wiring extends along the first direction.

Optionally, in some embodiments of the present application, the display panel further includes a partition channel wiring, and two terminals of the light-emitting lamp groups are connected to the data selection pins and the power line through the partition channel wiring.

Optionally, in some embodiments of the present application, there are four data selection pins in each of the driving chips, a number of the light-emitting lamp groups corresponding to each of the driving chips is four, the partition channel wiring includes first partition channel wirings and second partition channel wirings, one terminal of each of the light-emitting lamp groups is connected to one corresponding data selection pin through one of the first partition channel wirings, and another terminal of each of the light-emitting lamp groups is connected to the power line through the second partition channel wirings.

Optionally, in some embodiments of the present application, the driving chips further include at least one idle pin, and the idle pin is located at a column where the power signal pin is located at or a column where the data selection pin is located at.

Optionally, in some embodiments of the present application, the grounding signal wiring, the driving chip input output signal wiring, the data transmission wiring, the driving chip power wiring, the data readback wiring, the first partition channel wirings, the second partition channel wirings, and the power line are disposed in a same layer and are spaced apart.

Optionally, in some embodiments of the present application, the first partition channel wirings and the second partition channel wirings are arranged along the first direction.

The present application discloses a display panel. The display panel includes the grounding signal wiring, the plurality of light-emitting lamp groups, the driving chips, the driving chip input output signal wiring, and the power line. The power line and the grounding signal wiring are disposed parallelly and are spaced apart. The plurality of driving chips are disposed between the grounding signal wiring and the power line. Each of the driving chips includes the grounding signal pin, the stage-transfer signal input pin, the stage-transfer signal output pin, and the plurality of data selection pins. The grounding signal pin, the stage-transfer signal input pin, and the stage-transfer signal output pin are spaced apart on a side of the driving chips close to the grounding signal wiring along the first direction. The plurality of data selection pins are spaced apart on a side of the driving chips close to the power line along the first direction. The grounding signal pin is connected to the grounding signal wiring.

The driving chip input output signal wiring is configured to connect the stage-transfer signal input pin and the stage-transfer signal output pin of two adjacent driving chips. The plurality of light-emitting lamp groups are located between the driving chips and the power line. One terminal of each of the light-emitting lamp groups is connected to corresponding data selection pins. Another one terminal of each of the light-emitting lamp groups is connected to the power line. Wherein, the grounding signal wiring, the driving chip input output signal wiring, and the power line are disposed in a same layer and do not intersect with each other. In the present application, by disposing the grounding signal wiring, the driving chip input output signal wiring, and the power line in a same layer, the problem of short circuit easily appearing due to the grounding signal wiring, the driving chip input output signal wiring, and the power line being disposed in different layers can be prevented, thereby improving yield of the display panels.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device. In the present application, a "reaction" can be a chemical reaction or a physical reaction.

One embodiment of the present application provides a display panel. The display panel includes a grounding signal wiring, a plurality of light-emitting lamp groups, driving chips, a driving chip input output signal wiring, and a power line. The power line and the grounding signal wiring are disposed parallelly and are spaced apart. The plurality of driving chips are disposed between the grounding signal wiring and the power line. Each of the driving chips includes a grounding signal pin, a stage-transfer signal input pin, a stage-transfer signal output pin, and a plurality of data selection pins. The grounding signal pin, the stage-transfer signal input pin, and the stage-transfer signal output pin are spaced apart on a side of the driving chips close to the grounding signal wiring along a first direction. The plurality of data selection pins are spaced apart on a side of the driving chips close to the power line along the first direction. The grounding signal pin is connected to the grounding signal wiring. The driving chip input output signal wiring is configured to connect the stage-transfer signal input pin and the stage-transfer signal output pin of two adjacent driving chips. The plurality of light-emitting lamp groups are located between the driving chips and the power line. One terminal of each of the light-emitting lamp groups is connected to corresponding data selection pins. Another one terminal of each of the light-emitting lamp groups is connected to the power line. Wherein, the grounding signal wiring, the driving chip input output signal wiring, and the power line are disposed in a same layer and do not intersect with each other.

In the present application, by disposing the grounding signal wiring, the driving chip input output signal wiring, and the power line in a same layer and not intersecting with each other, the problem of short circuit easily appearing due to the grounding signal wiring, the driving chip input output signal wiring, and the power line being disposed in different layers can be prevented, thereby improving yield of the display panels.

The details are described below.

Figure 1:
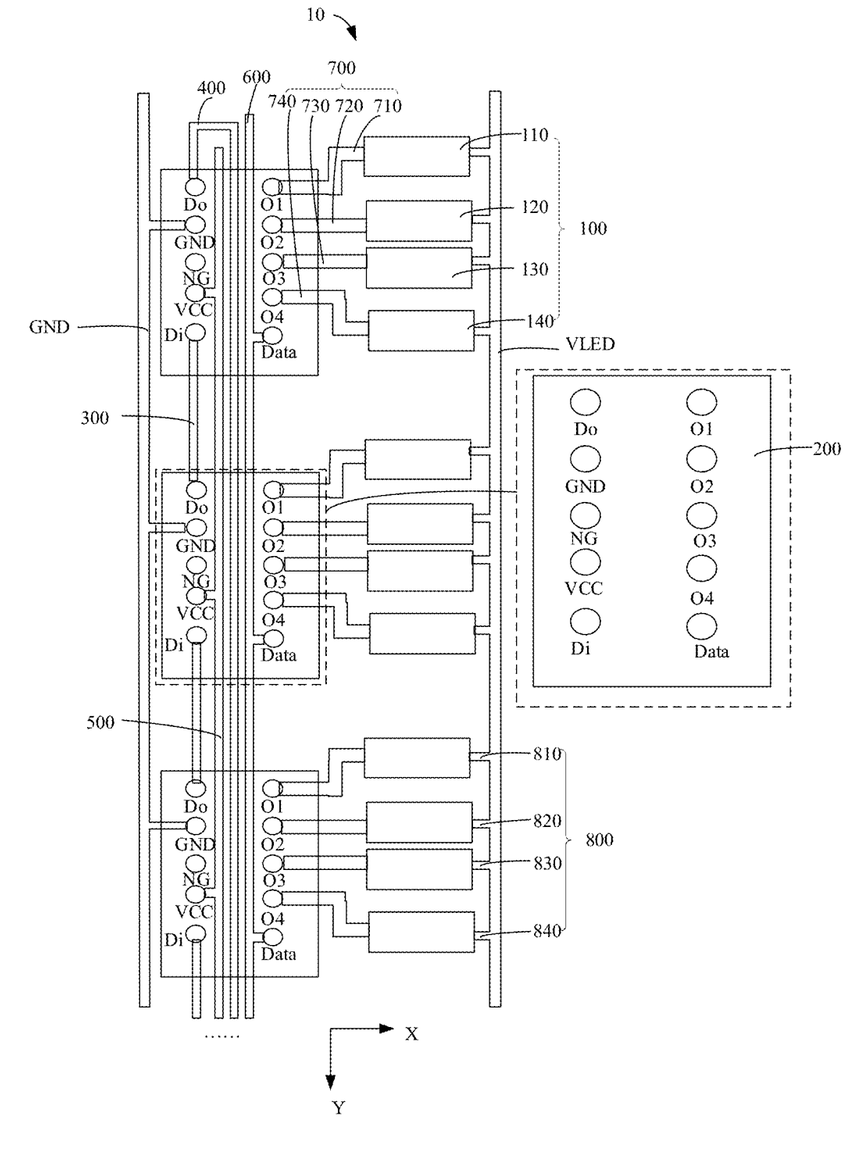
FIG. 1 is a planar schematic diagram of a display panel provided by one embodiment of the present application.

Please refer to FIG. 1. FIG. 1 is a planar schematic diagram of a display panel provided by one embodiment of the present application. The display panel 10 includes a grounding signal wiring GND, a plurality of light-emitting lamp groups 100, driving chips 200, a driving chip input output signal wiring 300, and a power line VLED. The grounding signal wiring GND and the power line VLED are disposed parallelly and are spaced apart. The plurality of driving chips 200 are disposed between the grounding signal wiring GND and the power line VLED. Each of the driving chips 200 includes a grounding signal pin GND, a stage-transfer signal input pin Di, a stage-transfer signal output pin Do, and a plurality of data selection pins. The grounding signal pin GND, the stage-transfer signal input pin Di, and the stage-transfer signal output pin Do are spaced apart on a side of the driving chips 200 close to the grounding signal wiring GND along the first direction Y. The plurality of data selection pins are spaced apart on a side of the driving chips 200 close to the power line VLED along the first direction Y. The grounding signal pin GND is connected to the grounding signal wiring GND. The driving chip input output signal wiring 300 is configured to connect the stage-transfer signal input pin Di and the stage-transfer signal output pin Do of two adjacent driving chips 200. The plurality of light-emitting lamp groups 100 are located between the driving chips 200 and the power line VLED. One terminal of each of the light-emitting lamp groups 100 is connected to corresponding data selection pins. Another one terminal of each of the light-emitting lamp groups 100 is connected to the power line VLED. Wherein, the grounding signal wiring GND, the driving chip input output signal wiring 300, and the power line VLED are disposed in a same layer and do not intersect with each other.

Wherein, the grounding signal wiring GND is configured to input a ground signal of an external driving element into the driving chips 200. The driving chip input output signal wiring 300 is configured to transmit an address signal. The grounding signal wiring GND, the driving chip input output signal wiring 300, and the power line VLED extend along the first direction Y.

In one embodiment, a size of the driving chips 200 is less than 1500 um*1500 um.

In one embodiment, the stage-transfer signal output pin Do, the grounding signal pin GND, and the stage-transfer signal input pin Di are sequentially arranged and spaced apart along the first direction Y.

In one embodiment, a planar shape of the pins can be circle, rectangle, square or other shapes, etc.

In one embodiment, the display panel 10 further includes a data readback wiring 400. The data readback wiring 400 extends along the first direction Y and is disposed between the stage-transfer signal input pin Di and the data selection pins. The data readback wiring 400, the grounding signal wiring GND, the power line VLED, and the driving chip input output signal wiring 300 are disposed in a same layer and do not intersect with each other. The data readback wiring 400 is located on a side of the driving chip input output signal wiring 300 away from the grounding signal wiring GND. The data readback wiring 400 extends along the first direction Y. A terminal portion of the data readback wiring 400 is connected to the stage-transfer signal output pin Do of the driving chip 200 on an outermost side.

In one embodiment, the data readback wiring 400 includes a part of the wiring extending along the first direction Y and a part of the wiring extending along a second direction X connected to the part of the wiring extending along the first direction Y.

In one embodiment, a data signal pin Data and a power signal pin VCC are further disposed in the driving chips 200. The display panel 10 further includes a driving chip power wiring 500 and a data transmission wiring 600. The data signal pin Data and the power signal pin VCC are located on two sides of the data readback wiring 400. The data transmission wiring 600 extends along the first direction Y and is located between the data signal pin Data and the data readback wiring 400. The driving chip power wiring 500 extends along the first direction Y and is located between the power signal pin VCC and the data readback wiring 400. The data transmission wiring 600 is connected to the data signal pin Data. The driving chip power wiring 500 is connected to the power signal pin VCC.

Specifically, the power signal pin VCC, the grounding signal pin GND, the stage-transfer signal output pin Do, and the stage-transfer signal input pin Di are arranged spaced apart along the first direction Y and are located on a side of the data readback wiring 400 close to the grounding signal wiring GND. The power signal pin VCC is located between the grounding signal pin GND and the stage-transfer signal input pin Di, i.e., the stage-transfer signal input pin Di and the stage-transfer signal output pin Do are located on a terminal portion of pins in a column where they are located. That is, the stage-transfer signal input pin Di and the stage-transfer signal output pin are located on two sides of the grounding signal pin GND. The stage-transfer signal output pin Do, the grounding signal pin GND, the power signal pin VCC, and the stage-transfer signal input pin Di are sequentially arranged along the first direction Y. The data signal pin Data and the plurality of data selection pins are arranged spaced apart along the first direction Y and are located on a side of the data readback wiring 400 away from the grounding signal wiring GND. The plurality of data selection pins and the power signal pin VCC are sequentially arranged spaced apart along the first direction Y. The data transmission wiring 600 is configured to transmit a data signal of the external driving element to the driving chip 200. The driving chip power wiring 500, the data readback wiring 400, and the data transmission wiring 600 are located between the grounding signal wiring GND and the power line VLED, extend along the first direction Y, and are sequentially arranged spaced apart along the second direction X simultaneously. The second direction X intersects with the first direction Y.

Wherein, each of the driving chip power wiring 500 is connected to the power signal pin VCC of the plurality of driving chips 200. Each data transmission wiring 600 is connected to the data signal pin Data of the plurality of driving chips 200.

In one embodiment, the driving chip power wiring 500, the data transmission wiring 600, the grounding signal wiring GND, the driving chip input output signal wiring 300, and the power line VLED are disposed in a same layer and do not intersect with each other.

It should be noted that positions of the power signal pin VCC and data signal pin Data can be exchanged. For example, the data signal pin Data is located between the grounding signal pin GND and the stage-transfer signal input pin Di. The power signal pin VCC and the plurality of data selection pins are arranged spaced apart along the first direction Y. Correspondingly, while the power signal pin VCC and the data signal pin Data are exchanged, positions of the drivin chip power wiring 500 and the data transmission wiring 600 also need to be exchanged.

In one embodiment, the driving chips 200 further include at least one idle pin NG. The idle pin NG is located at a column where the power signal pin VCC is located at or a column where the data selection pin Data is located at. Specifically, the idle pin NG, the power signal pin VCC, the grounding signal pin GND, the stage-transfer signal output pin Do, and the stage-transfer signal input pin Di are arranged spaced apart along the first direction Y and are located on a side close to the grounding signal wiring GND, and the idle pin NG is located between the power signal pin VCC and the grounding signal pin GND; or the idle pin NG, the data selection pin Data, the grounding signal pin GND, the stage-transfer signal output pin Do, and the stage-transfer signal input pin Di are arranged spaced apart along the first direction Y and are located on a side close to the grounding signal wiring GND, and the idle pin NG is located between the data selection pin Data and the grounding signal pin GND.

In one embodiment, the display panel 10 further includes a partition channel wiring. Two terminals of the light-emitting lamp groups 100 are connected to one of the data selection pins and the power line VLED through the partition channel wiring.

In one embodiment, there are four data selection pins in each of the driving chips 200. The four data selection pins include a first data selection pin O1, a second data selection pin O2, a third data selection pin O3, and a fourth data selection pin O4. The partition channel wiring includes first partition channel wirings 700 and second partition channel wirings 800. The plurality of light-emitting lamp groups 100 are arranged along the first direction Y. A number of light-emitting lamp groups 100 is four. The four light-emitting lamp groups 100 include a first light-emitting lamp group 110, a second light-emitting lamp group 120, a third light-emitting lamp group 130, and a fourth light-emitting lamp group 140. One terminal of each of the light-emitting lamp groups 100 is connected to one corresponding data selection pin through the first partition channel wiring 700. Another terminal of each of the light-emitting lamp groups 100 is connected to the power line VLED through the second partition channel wiring 700.

Specifically, the data signal pin Data, the first data selection pin O1, the second data selection pin O2, the third data selection pin O3, and the fourth data selection pin O4 are arranged along the first direction Y; or the power signal pin VCC, the first data selection pin O1, the second data selection pin O2, the third data selection pin O3, and the fourth data selection pin O4 are arranged along the first direction Y. The first partition channel wirings 700 are located between the data readback wiring 400 and the light-emitting lamp groups 100. The first partition channel wirings 700 include a first partition wiring 710, a second partition wiring 720, a third partition wiring 730, and a fourth partition wiring 740. The first partition wiring 710, the second partition wiring 720, the third partition wiring 730, and the fourth partition wiring 740 are disposed in a same layer and do not intersect with each other. One terminal of the first light-emitting lamp groups 110 is connected to the first data selection pin O1 through the first partition wiring 710. One terminal of the second light-emitting lamp groups 120 is connected to the second data selection pin O2 through the second partition wiring 720. One terminal of the third light-emitting lamp groups 130 is connected to the third data selection pin O3 through the third partition wiring 730. One terminal of the fourth light-emitting lamp groups 140 is connected to the fourth data selection pin O4 through the fourth partition wiring 740.

Furthermore, the second partition channel wirings 800 are located between the power line VLED and the light-emitting lamp groups 100. The second partition channel wirings 800 include a first channel wiring 810, a second channel wiring 820, a third channel wiring 830, and a fourth channel wiring 840. The first channel wiring 810, the second channel wiring 820, the third channel wiring 830, and the fourth channel wiring 840 are disposed in a same layer and do not intersect with each other. Another terminal of the first light-emitting lamp groups 110 is connected to the power line VLED through the first channel wiring 810. Another terminal of the second light-emitting lamp groups 120 is connected to the power line VLED through the second channel wiring 820. Another terminal of the third light-emitting lamp groups 130 is connected to the power line VLED through the third channel wiring 830. Another terminal of the fourth light-emitting lamp groups 140 is connected to the power line VLED through the fourth channel wiring 840.

It should be noted that positions of the data signal pin Data, the first data selection pin O1, the second data selection pin O2, the third data selection pin O3, and the fourth data selection pin O4 can be exchanged. While the positions of the data signal pin Data, the first data selection pin O1, the second data selection pin O2, the third data selection pin O3, and the fourth data selection pin O4 are exchanged, positions of corresponding wirings connected to them are also exchanged simultaneously. Or, the positions of the power signal pin VCC, the first data selection pin O1, the second data selection pin O2, the third data selection pin O3, and the fourth data selection pin O4 can be exchanged. While the positions of the power signal pin VCC, the first data selection pin O1, the second data selection pin O2, the third data selection pin O3, and the fourth data selection pin O4 are exchanged, positions of corresponding wirings connected to them are also exchanged.

In another embodiment, the number of the data selection pins in each driving chip 200 can also be configured to be less than four or more than four.

In one embodiment, the grounding signal wiring GND, the driving chip input output signal wiring 300, the driving chip power wiring 500, the data readback wiring 400, the data transmission wiring 600, the first partition channel wirings 700, the second partition channel wirings 800, and the power line VLED are disposed in a same layer and are spaced apart.

Wherein, light emitting diode (LED) lamps are disposed in each light-emitting lamp groups 100. LED lamps can also be mini-LED lamps. A number of the LED lamps can be 1, 2, 4, 6, 8, 10, 12, 14 or 16 etc. When the number of LED lamp is at least two, the LED lights are connected in series or in parallel. A distance between the LED lamps is not limited.

As an example, the stage-transfer signal output pin Do, the grounding signal pin GND, the idle pin NG, the power signal pin VCC, and the stage-transfer signal input pin Di are sequentially arranged along the first direction Y. The stage-transfer signal output pin Do, the grounding signal pin GND, the idle pin NG, the power signal pin VCC, and the stage-transfer signal input pin Di are located on a side of the data readback wiring 400 close to the grounding signal wiring GND. The first data selection pin O1, the second data selection pin O2, the third data selection pin O3, the fourth data selection pin O4, and the data selection pin Data are sequentially arranged along the first direction Y. The first data selection pin O1, the second data selection pin O2, the third data selection pin O3, the fourth data selection pin O4, and the data selection pin Data are located on a side of the data readback wiring 400 away from the grounding signal wiring GND. The stage-transfer signal output pin Do is symmetrically disposed with the first data selection pin O1, i.e., the stage-transfer signal output pin Do and the first data selection pin O1 are sequentially arranged along the second direction X. The grounding signal pin GND is symmetrically disposed with the second data selection signal pin O2. The idle pin NG is symmetrically disposed with the third data selection signal pin O3. The power signal pin VCC is symmetrically disposed with the fourth data selection signal pin O4. The stage-transfer signal input pin Di is symmetrically disposed with the data signal pin Data. The grounding signal wiring GND, the driving chip input output signal wiring 300, the driving chip power wiring 500, the data readback wiring 400, the data transmission wiring 600, the first partition channel wirings 700, the second partition channel wirings 800, and the power line VLED are sequentially arranged along the second direction X. The grounding signal wiring GND, the driving chip input output signal wiring 300, the data transmission wiring 600, the driving chip power wiring 500, the data readback wiring 400, and the power line VLED extend along the first direction Y, and the grounding signal wiring GND, the driving chip input output signal wiring 300, the data transmission wiring 600, the driving chip power wiring 500, the data readback wiring 400, and the power line VLED are in a same layer and are disposed spaced apart. The driving chip input output signal wiring 300, the driving chip power wiring 500, the data readback wiring 400, the data transmission wiring 600, the first partition channel wirings 700 are located between the grounding signal wiring GND and the lighting lamp groups 100. The second partition channel wirings 800 are located between the lighting lamp groups 100 and the power line VLED. The first partition channel wirings 700 and the second partition channel wirings 800 extend along the second direction X. The first light-emitting lamp group 110, the second light-emitting lamp group 120, the third light-emitting lamp group 130, and the fourth light-emitting lamp group 140 are sequentially arranged along the first direction Y. The stage-transfer signal output pin Do and the stage-transfer signal input pin Di of two adjacent driving chips 200 are connected through the driving chip input output signal wiring 300. The grounding signal pin GND is connected to the grounding signal wiring GND. The power signal pin VCC is connected to the driving chip power wiring 500. The data transmission wiring 600 is connected to the data signal pin Data. One terminal of the first light-emitting lamp groups 110 is connected to the first data selection pin O1 through the first partition wiring 710. Another terminal of the first light-emitting lamp groups 110 is connected to the power line VLED through the first channel wiring 810. One terminal of the second light-emitting lamp groups 120 is connected to the second data selection pin O2 through the second partition wiring 720. Another terminal of the second light-emitting lamp groups 120 is connected to the power line VLED through the second channel wiring 820. One terminal of the third light-emitting lamp groups 130 is connected to the third data selection pin O3 through the third partition wiring 730. Another terminal of the third light-emitting lamp groups 130 is connected to the power line VLED through the third channel wiring 830. One terminal of the fourth light-emitting lamp groups 140 is connected to the fourth data selection pin O4 through the fourth partition wiring 740. Another terminal of the fourth light-emitting lamp groups 140 is connected to the power line VLED through the fourth channel wiring 840. That is, there are 10 pins in the driving chips 200.

Or, the stage-transfer signal output pin Do, the grounding signal pin GND, the idle pin NG, the data signal pin Data, and the stage-transfer signal input pin Di are sequentially arranged along the first direction Y. The stage-transfer signal output pin Do, the grounding signal pin GND, the idle pin NG, the data signal pin Data, and the stage-transfer signal input pin Di are located on a side of the data readback wiring 400 close to the grounding signal wiring GND. The first data selection pin O1, the second data selection pin O2, the third data selection pin O3, the fourth data selection pin O4, and the power signal pin VCC are sequentially arranged along the first direction Y. The first data selection pin O1, the second data selection pin O2, the third data selection pin O3, the fourth data selection pin O4, and the power signal pin VCC are located on a side of the data readback wiring 400 away from the grounding signal wiring GND. The stage-transfer signal output pin Do is symmetrically disposed with the first data selection pin O1. The grounding signal pin GND is symmetrically disposed with the second data selection signal pin O2. The idle pin NG is symmetrically disposed with the third data selection signal pin O3. The data signal pin Data is symmetrically disposed with the fourth data selection signal pin O4. The stage-transfer signal input pin Di is symmetrically disposed with the power signal pin VCC. The grounding signal wiring GND, the driving chip input output signal wiring 300, the data transmission wiring 600, the data readback wiring 400, the driving chip power wiring 500, the first partition channel wirings 700, the second partition channel wirings 800, and the power line VLED are sequentially arranged along the second direction X. The grounding signal wiring GND, the driving chip input output signal wiring 300, the data transmission wiring 600, the driving chip power wiring 500, the data readback wiring 400, and the power line VLED extend along the first direction Y, and the grounding signal wiring GND, the driving chip input output signal wiring 300, the data transmission wiring 600, the driving chip power wiring 500, the data readback wiring 400, and the power line VLED are in a same layer and are spaced apart. The driving chip input output signal wiring 300, the driving chip power wiring 500, the data readback wiring 400, the data transmission wiring 600, the first partition channel wirings 700 are located between the grounding signal wiring GND and the lighting lamp groups 100. The second partition channel wirings 800 are located between the lighting lamp groups 100 and the power line VLED. The first partition channel wirings 700 and the second partition channel wirings 800 extend along the second direction X. The first light-emitting lamp group 110, the second light-emitting lamp group 120, the third light-emitting lamp group 130, and the fourth light-emitting lamp group 140 are sequentially arranged along the first direction Y. The stage-transfer signal output pin Do and the stage-transfer signal input pin Di of two adjacent driving chips 200 are connected through the driving chip input output signal wiring 300. The grounding signal pin GND is connected to the grounding signal wiring GND. The power signal pin VCC is connected to the driving chip power wiring 500. The data transmission wiring 600 is connected to the data signal pin Data. One terminal of the first light-emitting lamp groups 110 is connected to the first data selection pin O1 through the first partition wiring 710. Another terminal of the first light-emitting lamp groups 110 is connected to the power line VLED through the first channel wiring 810. One terminal of the second light-emitting lamp groups 120 is connected to the second data selection pin O2 through the second partition wiring 720. Another terminal of the second light-emitting lamp groups 120 is connected to the power line VLED through the second channel wiring 820. One terminal of the third light-emitting lamp groups 130 is connected to the third data selection pin O3 through the third partition wiring 730. Another terminal of the third light-emitting lamp groups 130 is connected to the power line VLED through the third channel wiring 830. One terminal of the fourth light-emitting lamp groups 140 is connected to the fourth data selection pin O4 through the fourth partition wiring 740. Another terminal of the fourth light-emitting lamp groups 140 is connected to the power line VLED through the fourth channel wiring 840.

In another embodiment, there can be more than 10 pins or less than 10 pins disposed in the driving chips 200.

In the present application, by disposing the grounding signal wiring GND, the driving chip input output signal wiring 300, the data transmission wiring, the driving chip power wiring, the data readback wiring, and the power line VLED in a same layer and spaced apart, and by adjusting positions of the stage-transfer signal output pin Do, the grounding signal pin GND, the idle pin NG, the power signal pin VCC, the stage-transfer signal input pin Di, the plurality of data selection pins, and the data signal pin Data, jumper wires of the wirings are allowed to be reduced, thereby preventing the problem of short circuit easily appearing. Therefore, yield of the display panel 10 is improved, and cost is reduced. Meanwhile, disposing the idle pin NG in the driving chips 200 allows arrangement the pins of the driving chips 200 to be balanced and symmetrical, simplifies manufacturing processes of the driving chips 200, and shortens manufacturing periods, thereby reducing cost.

Working principle: a positive voltage of the LED lamp provided by the external driving element is transmitted to the light-emitting lamp groups 100 through the power line VLED; after the address signal provided by the external driving element is transmitted to the driving chip 200 through the driving chip input output signal wiring 300 of the driving chips 200, after a transmission power signal provided by the external driving element is transmitted to the driving chip 200 through the driving chip power wiring VCC, after the data signal provided by the external driving element is transmitted to the driving chips 200 through the data transmission line Data, and after the grounding signal provided by the external driving element is transmitted to the driving chips 200 through the grounding signal wiring GND; output voltages of the first data selection pin O1, the second data selection pin O2, the third data selection pin O3, and the fourth data selection pin O4 of the driving chips 200 are controlled to be different, i.e., the output voltages of the four channels are different. Therefore, negative voltages of the LED lamps of each light-emitting lamp group are different. Therefore, brightness of the LEDs of each light-emitting lamp group is controlled to be different, thereby making the display panel 10 to work.

It should be noted that the display panel 10 provided by the present application can be products of mini-LED backlight sources or products of mini-LED display screens.

The present application discloses a display panel 10. The display panel 10 includes a grounding signal wiring GND, light-emitting lamp groups 100, driving chips 200, a driving chip input output signal wiring 300, a driving chip power wiring 500, a data readback wiring 400, a data transmission wiring 600, and a power line VLED. The driving chip input output signal wiring 300 is located between the grounding signal wiring GND and the driving chip power wiring 500. The data readback wiring 400 is between the driving chip input output signal wiring 300 and the data transmission wiring 600. The data transmission wiring 600 is located between the data readback wiring 400 and the power line VLED. The grounding signal wiring GND is connected to the driving chips 200. The driving chip input output signal wiring 300 is connected to two adjacent driving chips 200. The driving chip power wiring 500 is connected to the driving chip 200 at a beginning terminal and to the driving chip 200 at an end terminal. The light-emitting lamp groups 100 are connected to the driving chips 200. The light-emitting lamp groups 100 are connected to the power line VLED. The grounding signal wiring GND, the driving chip input output signal wiring 300, the driving chip power wiring 500, the data readback wiring 400, the data transmission wiring 600, and the power line VLED are disposed in a same layer. In the present application, by disposing the grounding signal wiring GND, the driving chip input output signal wiring 300, the driving chip power wiring 500, the data readback wiring 400, the data transmission wiring 600, and the power line VLED in a same layer and spaced apart, and by simultaneously adjusting positions of the corresponding pins, the problem of short circuit easily appearing incurred by disposing the grounding signal wiring GND, the driving chip input output signal wiring 300, the driving chip power wiring 500, the data readback wiring 400, the data transmission wiring 600, and the power line VLED in different layers can be prevented, thereby improving the yield of the display panel 10 and reducing cost.

The above describes the display panel provided by the embodiments of the present application in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A display panel, wherein the display panel comprises:
   a grounding signal wiring;
   a power line, wherein the power line and the grounding signal wiring are disposed parallelly and are spaced apart, and the power line and the grounding signal wiring extend along a first direction;
   a plurality of driving chips, wherein the plurality of driving chips are disposed between the grounding signal wiring and the power line, each of the driving chips comprises a grounding signal pin, a stage-transfer signal input pin, a stage-transfer signal output pin, and a plurality of data selection pins, the grounding signal pin, the stage-transfer signal input pin, and the stage-transfer signal output are spaced apart on a side of the driving chips close to the grounding signal wiring along the first direction, and the plurality of data selection pins are spaced apart on a side of the driving chips close to the power line along the first direction, and the grounding signal pin is connected to the grounding signal wiring;
   a driving chip input output signal wiring, wherein the driving chip input output signal wiring is configured to connect the stage-transfer signal input pin and the stage-transfer signal output pin of two adjacent driving chips; and
   a plurality of light-emitting lamp groups, wherein the plurality of light-emitting lamp groups are located between the driving chips and the power line, one terminal of each of the light-emitting lamp groups is connected to corresponding data selection pins, and another one terminal of each of the light-emitting lamp groups is connected to the power line; and
   wherein the grounding signal wiring, the driving chip input output signal wiring, and the power line are disposed in a same layer and do not intersect with each other.

2. The display panel as claimed in claim 1, wherein the display panel comprises a data readback wiring, the data readback wiring extends along the first direction and is disposed between the stage-transfer signal input pin and the data selection pins, and a terminal portion of the data readback wiring is connected to the stage-transfer signal output pin of the driving chip on an outermost side.

3. The display panel as claimed in claim 2, wherein the driving chips comprise a data signal pin and a power signal pin, the data signal pin and the power signal pin are respectively located on two sides of the data readback wiring, the display panel comprises a data transmission wiring and a driving chip power wiring, the data transmission wiring extends along the first direction and is located between the data signal pin and the data readback wiring, the driving chip power wiring extends along the first direction and is located between the power signal pin and the data readback wiring, the data transmission wiring is connected to the data signal pin, and the driving chip power wiring is connected to the power signal pin.

4. The display panel as claimed in claim 3, wherein the data signal pin and the plurality of data selection pins are arranged along the first direction, the power signal pin, the stage-transfer signal input pin, the stage-transfer signal output pin, and the grounding signal pin are arranged along the first direction, and the stage-transfer signal input pin and the stage-transfer signal output pin are located on two sides of the grounding signal pin.

5. The display panel as claimed in claim 4, wherein the plurality of driving chips are arranged along the first direction, the stage-transfer signal input pin and the stage-transfer signal output pin are located on a terminal portion of pins in a column where the stage-transfer signal input pin and the stage-transfer signal output pin are located, and the driving chip input output signal wiring extends along the first direction.

6. The display panel as claimed in claim 5, wherein the display panel comprises a partition channel wiring, and two terminals of the light-emitting lamp groups are connected to the data selection pins and the power line through the partition channel wiring.

7. The display panel as claimed in claim 6, wherein there are four data selection pins in each of the driving chips, a number of the light-emitting lamp groups corresponding to each of the driving chips is four, the partition channel wiring comprises first partition channel wirings and second partition channel wirings, one terminal of each of the light-emitting lamp groups is connected to one corresponding data selection pin through one of the first partition channel wirings, and another terminal of each of the light-emitting lamp groups is connected to the power line through the second partition channel wirings.

8. The display panel as claimed in claim 7, wherein the driving chips comprise at least one idle pin, and the idle pin is located at a column where the power signal pin is located at or a column where the data selection pin is located at.

9. The display panel as claimed in claim 8, wherein the grounding signal wiring, the driving chip input output signal wiring, the data transmission wiring, the driving chip power wiring, the data readback wiring, the first partition channel wirings, the second partition channel wirings, and the power line are disposed in a same layer and are spaced apart.

10. The display panel as claimed in claim 9, wherein the first partition channel wirings and the second partition channel wirings are arranged along the first direction.

11. A display panel, wherein the display panel comprises:
a grounding signal wiring;
a power line, wherein the power line and the grounding signal wiring are disposed parallelly and are spaced apart, and
a plurality of driving chips, wherein the plurality of driving chips are disposed between the grounding signal wiring and the power line, each of the driving chips comprises a grounding signal pin, a stage-transfer signal input pin, a stage-transfer signal output pin, and a plurality of data selection pins, the grounding signal pin, the stage-transfer signal input pin, and the stage-transfer signal output are spaced apart on a side of the driving chips close to the grounding signal wiring along a first direction, and the plurality of data selection pins are spaced apart on a side of the driving chips close to the power line along the first direction, and the grounding signal pin is connected to the grounding signal wiring;
a driving chip input output signal wiring, wherein the driving chip input output signal wiring is configured to connect the stage-transfer signal input pin and the stage-transfer signal output pin of two adjacent driving chips; and
a plurality of light-emitting lamp groups, wherein the plurality of light-emitting lamp groups are located between the driving chips and the power line, one terminal of each of the light-emitting lamp groups is connected to corresponding data selection pins, and another one terminal of each of the light-emitting lamp groups is connected to the power line; and
wherein the grounding signal wiring, the driving chip input output signal wiring, and the power line are disposed in a same layer and do not intersect with each other.

12. The display panel as claimed in claim 11, wherein the display panel comprises a data readback wiring, the data readback wiring extends along the first direction and is disposed between the stage-transfer signal input pin and the data selection pins, and a terminal portion of the data readback wiring is connected to the stage-transfer signal output pin of the driving chip on an outermost side.

13. The display panel as claimed in claim 12, wherein the driving chips comprise a data signal pin and a power signal pin, the data signal pin and the power signal pin are respectively located on two sides of the data readback wiring, the display panel comprises a data transmission wiring and a driving chip power wiring, the data transmission wiring extends along the first direction and is located between the data signal pin and the data readback wiring, the driving chip power wiring extends along the first direction and is located between the power signal pin and the data readback wiring, the data transmission wiring is connected to the data signal pin, and the driving chip power wiring is connected to the power signal pin.

14. The display panel as claimed in claim 13, wherein the data signal pin and the plurality of data selection pins are arranged along the first direction, the power signal pin, the stage-transfer signal input pin, the stage-transfer signal output pin, and the grounding signal pin are arranged along the first direction, and the stage-transfer signal input pin and the stage-transfer signal output pin are located on two sides of the grounding signal pin.

15. The display panel as claimed in claim 14, wherein the plurality of driving chips are arranged along the first direction, the stage-transfer signal input pin and the stage-transfer signal output pin are located on a terminal portion of pins in a column where the stage-transfer signal input pin and the stage-transfer signal output pin are located, and the driving chip input output signal wiring extends along the first direction.

16. The display panel as claimed in claim 15, wherein the display panel comprises a partition channel wiring, and two terminals of the light-emitting lamp groups are connected to the data selection pins and the power line through the partition channel wiring.

17. The display panel as claimed in claim 16, wherein there are four data selection pins in each of the driving chips, a number of the light-emitting lamp groups corresponding to each of the driving chips is four, the partition channel wiring comprises first partition channel wirings and second partition channel wirings, one terminal of each of the light-emitting lamp groups is connected to one corresponding data selection pin through one of the first partition channel wirings, and another terminal of each of the light-emitting lamp groups is connected to the power line through the second partition channel wirings.

18. The display panel as claimed in claim 17, wherein the driving chips comprise at least one idle pin, and the idle pin is located at a column where the power signal pin is located at or a column where the data selection pin is located at.

19. The display panel as claimed in claim 18, wherein the grounding signal wiring, the driving chip input output signal wiring, the data transmission wiring, the driving chip power wiring, the data readback wiring, the first partition channel wirings, the second partition channel wirings, and the power line are disposed in a same layer and are spaced apart.

20. The display panel as claimed in claim 19, wherein the first partition channel wirings and the second partition channel wirings are arranged along the first direction.

* * * * *